(12) United States Patent
Brovelli et al.

(10) Patent No.: US 11,049,989 B2
(45) Date of Patent: Jun. 29, 2021

(54) COLORLESS LUMINESCENT SOLAR CONCENTRATOR, FREE OF HEAVY METALS, BASED ON AT LEAST TERNARY CHALCOGENIDE SEMICONDUCTOR NANOCRYSTALS WITH ABSORPTION EXTENDING TO THE NEAR INFRARED REGION

(71) Applicant: UNIVERSITA' DEGLI STUDI DI MILANO—BICOCCA, Milan (IT)

(72) Inventors: Sergio Brovelli, Milan (IT); Francesco Meinardi, Lecco (IT); Francesco Carulli, Arona (IT)

(73) Assignee: UNIVERSITA' DEGLI STUDI DI MILANO—BICOCCA, Milan (IT)

( * ) Notice: Subject to any disclaimer, the term of this patent is extended or adjusted under 35 U.S.C. 154(b) by 129 days.

(21) Appl. No.: 15/541,146

(22) PCT Filed: Jan. 18, 2016

(86) PCT No.: PCT/IB2016/000032
§ 371 (c)(1),
(2) Date: Jun. 30, 2017

(87) PCT Pub. No.: WO2016/116803
PCT Pub. Date: Jul. 28, 2016

(65) Prior Publication Data
US 2018/0019355 A1 Jan. 18, 2018

(30) Foreign Application Priority Data
Jan. 19, 2015 (IT) .................. MI2015A00041

(51) Int. Cl.
*H01L 31/055* (2014.01)
*H01L 31/032* (2006.01)
*H01L 31/0352* (2006.01)

(52) U.S. Cl.
CPC .......... *H01L 31/055* (2013.01); *H01L 31/032* (2013.01); *H01L 31/0322* (2013.01);
(Continued)

(58) Field of Classification Search
CPC ... F24J 2/00; F24J 2/065; F24J 2/0433; C09K 11/02; C09K 11/881; C09K 11/641;
(Continued)

(56) References Cited

U.S. PATENT DOCUMENTS 6,476,312 B1 * 11/2002 Barnham ............... B82Y 10/00
                                                     136/246
8,409,473 B2 * 4/2013 Shi ........................ C01G 9/06
                                                     252/301.6 S (Continued)

FOREIGN PATENT DOCUMENTS

WO    WO 2015/002995    *    1/2015

OTHER PUBLICATIONS

International Search Report and Written Opinion for International Application No. PCT/IB2016/000032 (8 Pages) (dated Mar. 14, 2016).

*Primary Examiner* — C Melissa Koslow
(74) *Attorney, Agent, or Firm* — Lucas & Mercanti, LLP (57) ABSTRACT

The invention relates to a luminescent solar concentrator comprising a glass or plastic matrix containing colloidal nanocrystals of at least ternary semiconductors based on metals of groups IB and IIIA (groups 11 and 16 respectively in the UIPAC nomenclature) and at least one chalcogen (group VIA, or 16 in the IUPAC nomenclature).

15 Claims, 5 Drawing Sheets

(52) U.S. Cl.
CPC ...... *H01L 31/035218* (2013.01); *Y02E 10/52* (2013.01); *Y02E 10/541* (2013.01)

(58) Field of Classification Search
CPC ..... C09K 11/621; H10L 31/055; Y02E 10/52; Y10S 977/779; Y10S 977/813; Y10S 977/834; G01B 5/0003
See application file for complete search history.

(56) References Cited

U.S. PATENT DOCUMENTS

| | | |
|---|---|---|
| 9,103,529 B2* | 8/2015 | Edwards .................. F21S 11/00 |
| 2004/0095658 A1 | 5/2004 | Buretea et al. |
| 2008/0191027 A1* | 8/2008 | Yang ...................... G06K 19/06 |
| | | 235/491 |
| 2012/0222723 A1 | 9/2012 | Mayer et al. |
| 2013/0146141 A1 | 6/2013 | Pelton et al. |
| 2016/0380140 A1* | 12/2016 | McDaniel ............ C09K 11/025 |
| | | 136/247 |

* cited by examiner

COLORLESS LUMINESCENT SOLAR CONCENTRATOR, FREE OF HEAVY METALS, BASED ON AT LEAST TERNARY CHALCOGENIDE SEMICONDUCTOR NANOCRYSTALS WITH ABSORPTION EXTENDING TO THE NEAR INFRARED REGION

This application is a U.S. national stage of PCT/IB2016/000032 filed on January 2016 which claims the benefit of priority from Italian Patent Application No. MI2015000041 filed Jan. 19, 2015 the contents of each of which are incorporated herein by reference.

FIELD OF THE INVENTION

The present invention relates to a solar concentrator.

BACKGROUND OF THE INVENTION

As is known, luminescent solar concentrators (LSC) comprise a glass or plastic waveguide forming the body of the concentrator, coated or doped with highly emissive elements or components, commonly known as fluorophores. The direct and/or diffused sunlight is absorbed by these fluorophores and re-emitted at a higher wavelength. The luminescence generated in this way is propagated towards the edges of the waveguide by total internal reflection, and is converted to electrical energy by high-efficiency photovoltaic cells coupled to the perimeter of the body of the concentrator.

More particularly, a luminescent solar concentrator is conventionally composed of a body (that is to say, the aforementioned waveguide) having a generally sheet-like or parallelepipedal shape, doped with organic or organometallic fluorophores. The fluorophores absorb the incident light and re-emit it by fluorescence or phosphorescence. The emitted light is guided by total internal reflection to the edges of the waveguide, where it is converted, to electricity by the photovoltaic cells positioned along the lateral faces of the waveguide. By making an appropriate choice of the concentration of fluorophore in the waveguide and its optical properties, it is possible to provide coloured devices with a desired degree of transparency and in any shape which can easily be incorporated into architecture, in the form of photovoltaic windows for example.

Additionally, these devices or concentrators can be used to minimize the number of photovoltaic cells used by concentrating the light from a large area on smaller areas, thus making it financially viable to use non-standard photovoltaic modules which would otherwise be excessively costly. To produce efficient solar concentrators, the fluorophores must be highly photostable and have a wide absorption spectrum in the visible and near-infrared spectral region, high luminescence efficiency, and the greatest possible energy separation between the intrinsic absorption spectrum and the optical emission spectrum (denoted by the term "Stokes shift"). The last-mentioned requirement is fundamental for the manufacture of large concentrators in which the light emitted by a given fluorophore must cover relatively long distances before reaching the edge of the concentrator body (which generally, but not exclusively, has a layer-like or sheet-like shape).

There is a known way of using organic fluorophores which are highly emissive, but relatively photodegradable. Their Stokes shift is typically limited, resulting in significant optical losses due to the reabsorption of the light emitted by the fluorophores.

Attempts have been made to overcome this drawback of the use of organic fluorophores, by using organic rare earth complexes with large Stokes shifts; however, these elements can use only a small portion of the solar spectrum and/or exhibit very low luminescence efficiencies.

Similar problems are encountered when colloidal nanocrystals (QD) are used as emitters incorporated into the body or waveguide of a solar concentrator. In this case also, while these nanocrystals have high emission efficiency and a large optical absorption coefficient, they generally show a large overlap between the absorption spectrum and the emission spectrum, resulting in high reabsorption of the emitted light. This is an obstacle to the construction of large solar concentrators, limiting the size of the devices to a few square centimetres.

To overcome this problem, attempts have been made to produce core-shell QDs in which the core provides the emission function, while the shell is responsible for the absorption of solar radiation. This solution, demonstrated for QDs made of CdSe coated with a thick shell of CdS forming more than 90% of the volume of the nanoparticle, makes it possible to manufacture large solar concentrators, but suffers from intrinsic limitations which impede its use in a real context. This is because the QDs that are used have an absorption spectrum limited by the energy gap of the shell material (CdS) which falls in the green/yellow spectral region (about 520 nm), setting a limit on the maximum achievable efficiency and requiring the concentrator devices to be highly coloured. This inevitably affects their possible application in real architectural contexts or other uses in the real world.

Moreover, these QDs typically use toxic material such as cadmium, tellurium, lead and the like. This may prevent their use, for reasons of environmental protection and public health.

According to another embodiment, the self-absorption is eliminated by doping the QDs with transition metal ions which act as intra-gap recombination centres for the excitons photogenerated in the host semiconductor.

For example, it has been possible to produce a solar concentrator with QDs of the aforementioned type using ZnSe doped with Mn.

However, like the preceding strategy based on core-shell QDs, this doping with Mn and other transition metals is also subject to considerable limitations in terms of coverage of the solar spectrum, which considerably reduces the maximum efficiency that can be obtained. In this specific case, when devices based on QDs of ZnSe doped with Mn are used, it is intrinsically impossible to absorb the portion of solar radiation at wavelengths above 500 nm, resulting in high colouration of the final device, with negative effects on its efficiency and the possibilities for its architectural incorporation.

SUMMARY OF THE INVENTION

The object of the present invention is to provide a luminescent solar concentrator (LSC) which is an improvement on the known solutions and those which have been disclosed but are still in the design phase (such as those containing QDs of the core-shell type).

In particular, one object of the present invention is to provide a solar concentrator which can have high efficiency, that is to say a solar concentrator that has very low, or at least negligible (or even zero) optical losses due to reabsorption.

A further object is to provide a solar concentrator or device that is colourless, in other words one that has a neutral colour (gradations of grey like ordinary optical filters with neutral optical density), thus introducing no appreciable chromatic distortion, and which can therefore be used as an element suitable for architectural incorporation, such as a photovoltaic window for example, or in general as windows or glazing panels or transparent elements of fixed structures or moving structures such as vehicles.

Another object is to provide a solar concentrator or device that has an absorption spectrum extending throughout the visible and near-infrared region, so as to maximize the fraction of sunlight that can be used to generate electrical energy.

A further object is to produce a luminescent solar concentrator which is free of heavy metals (for example, but not exclusively, Pb, Cd and Hg) and other elements of known toxicity (for example, but not exclusively, Te and As), so that it can be used easily in an environmentally friendly way.

These and other objects, which will be evident to those skilled in the art, are achieved by a luminescent solar concentrator according to the appended claims.

To facilitate the understanding of the present invention, the following drawings are appended purely by way of non-limiting examples, in which drawings.

BRIEF DESCRIPTION OF THE DRAWINGS

DETAILED DESCRIPTION OF THE INVENTION

Figure 1:
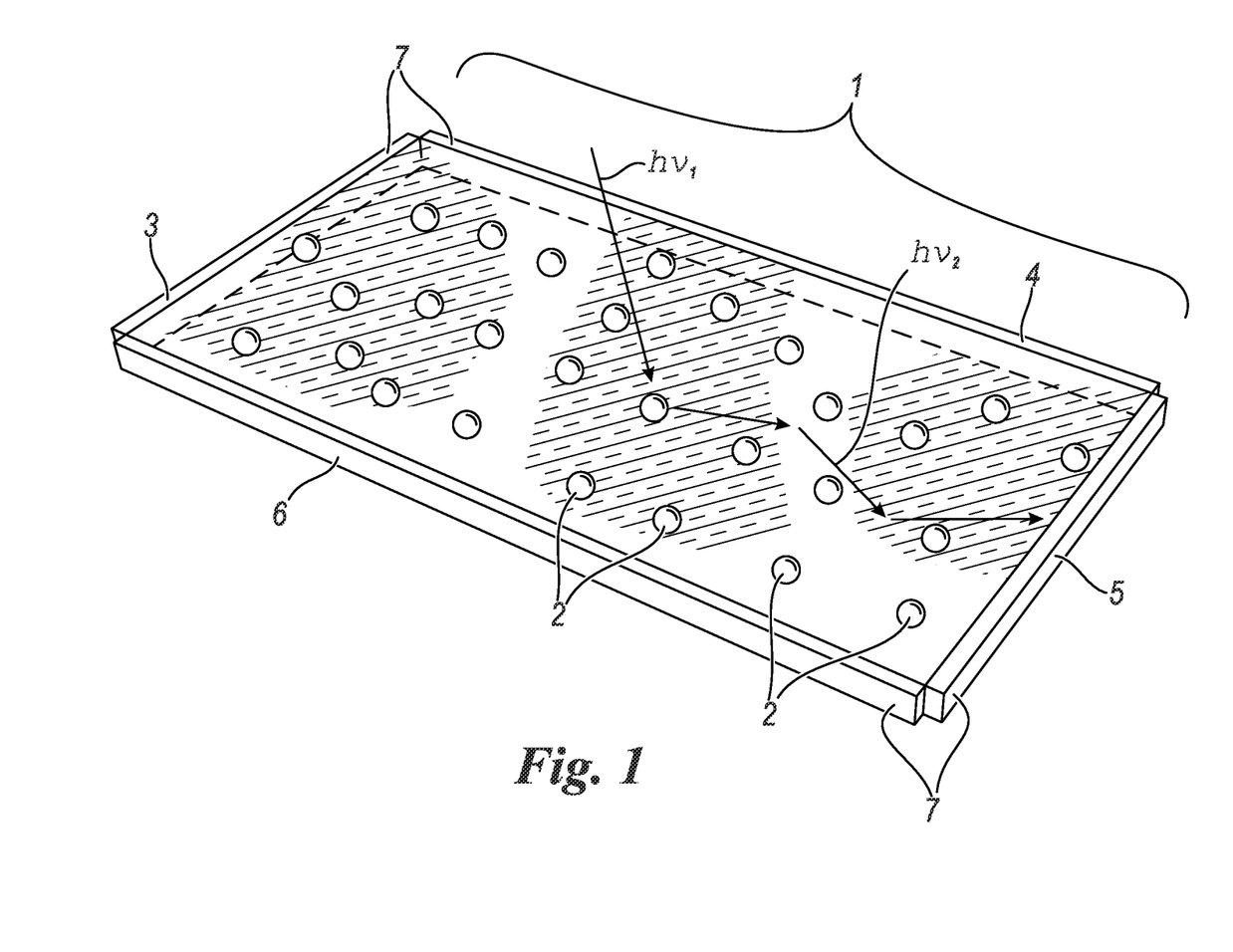
FIG. 1 shows a schematic representation of luminescent solar concentrator (LSC) consisting of a polymer matrix incorporating colloidal nanoparticles or nanocrystals or QDs.

With reference to the aforesaid figures, a luminescent solar concentrator or LSC comprises a body 1 made of glass or plastic material in which nanocrystals are present, these being shown, purely for descriptive purposes, as clearly identifiable elements in the body 1 of the concentrator; these nanocrystals or nanoparticles are denoted by 2. At the edges 3, 4, 5, 6 of the body 1 there are photovoltaic cells 7 for collecting and converting to electricity the light radiation (indicated as $hv_2$) emitted by the QDs present in the body 1. The incident radiation on the body of the device is indicated by $hv_1$.

The body 1 of the LSC may be made of various materials. Examples of these materials may include, but are not limited to the following: polyacrylates and polymethyl methacrylates, polyolefins, polyvinyls, epoxy resins, polycarbonates, polyacetates, polyamides, polyurethanes, polyketones, polyesters, polycyanoacrylates, silicones, polyglycols, polyimides, fluorinated polymers, polycellulose and derivatives such as methyl cellulose, hydroxymethyl cellulose, polyoxazines, and silica-based glasses.

The nanocrystals or nanoparticles are elements whose size is typically less than 10-20 nm and in any case is smaller than the exciton Bohr radius characteristic of the corresponding monolithic material having the same composition, so as to exhibit quantum confinement. These QDs can exhibit a photoluminescence efficiency of practically 100% and an emission spectrum that can be selected by dimensional control of the particles, allowing optimal integration with various types of solar cells comprising either single or multiple junction devices.

According to fundamental characteristic of the present invention, the colloidal nanocrystals used as emitters in the LSC described here are semiconductor QDs made of at least ternary chalcogenides, comprising transition metals of group $I_B$ (or group 11 in the IUPAC nomenclature), metals of group $III_A$ (or group 13 in the IUPAC nomenclature) and chalcogens of group VIA (or group in the IUPAC nomenclature). By way of non-limiting example, these semiconductors may be $CuInS_2$, $AgInS_2$, $CuInSe_2$, or $AgInSe_2$; alternatively, these nanocrystals are quaternary semiconductor chalcogenides also comprising transition metals of group $II_B$ (group 12 in the IUPAC nomenclature) such as, by way of non-limiting example, $CuInZnS_2$, $CuInZnSe_2$, or $AgInZnSe_2$, possibly coated with suitable organic and/or inorganic passivating layers, as described below. The nanocrystals may also be made of alloys of the aforementioned ternary or quaternary semiconductors (non-limiting examples are CuInSeS, AgInSeS, CuInZnSeS, and AgInZnSeS).

As a general rule, these QDs are ternary or quaternary semiconductors comprising transition metals of group $I_B$ (group 11 in the IUPAC nomenclature), metals of group $III_A$ (group 13 in the IUPAC nomenclature), together with at least one chalcogen of group $VI_A$ (group 16 in the IUPAC nomenclature) having the general formula of the $M^I M^{III} A^{VI}_2$ type or of the $M^I M^{III} A^{VI}_{2-x} B^{VI}_x$ type, or of the $M^I M^{III} M^{II}_- A^{VI}_{2-x} B^{VI}_x$ type, or of the $M^I M^{III} M^{II} A^{VI}_2$ type where:

$M^I$ is a transition metal of, group $I_B$ (or group 11 in the IUPAC nomenclature), $M^{III}$ is a transition metal of group $III_A$ (or group 13 in the IUPAC nomenclature), $M^{II}$ is a transition metal of group $II_B$ (or group 12 in the IUPAC nomenclature), $A^{VI}$ is a chalcogen of group $VI_A$ (or group 16 in the IUPAC nomenclature), $B^{VI}$ is a chalcogen of group $VI_A$ (or group 16 in the IUPAC nomenclature), X are the atoms of element $B^{VI}$ wherein x is $0<X<2$, and 2-x are the atoms of element $A^{VI}$, wherein x is $0<X<2$ By contrast with the aforementioned QDs of the core-shell type, that is to say heterogeneous QDs, they form a homogeneous structure in which the optical absorption is due to band-to-band transitions of the semiconductor material, while the emission of light at a higher wavelength than that of the absorbed light takes place, instead, by the radiative recombination of a carrier in a band of the semiconductor with the respective carrier of opposite sign located in an intra-gap defect state in the crystal lattice. Thus the emitted light is not reabsorbed by the QDs, and is propagated in the waveguide to the sides 3-6 of the latter, where one or more inorganic or organic solar cells 7 are positioned, these cells converting the concentrated light to electrical energy.

This particular choice of QDs, used as a homogeneous structure instead of a core-shell hetero-structure, makes it possible to produce luminescent solar concentrators with large dimensions (tens to hundreds of linear centimetres) with limited optical losses due to the reabsorption of the emitted light. The concentration of the nanocrystals dispersed in the solid matrix or body 1 determines the degree of transparency of the concentrator or device, making it possible to produce semi-transparent solar concentrators suitable for use as photovoltaic windows in architectural structures such as buildings, or in moving structures such as motor vehicles. By way of non-limiting example, in the case of CdSeS QDs with ZnS passivation and emission at 970 nm, it is possible to use a QD concentration of 0.5% by weight relative to the combined material composed of cross-linked poly(lauryl methacrylate) and QD in order to produce devices capable of absorbing 20% (approximately) of the sunlight incident on the LSC.

The selection of the composition and dimensions of the QDs, by choosing overall parameters such as the type and concentration of the reagents, the temperature and the reaction time, also makes it possible to obtain absorption spectra extending over the whole visible near infra-red region, which maximizes the efficiency of the device and imparts a neutral colouring in gradations of grey to the final material (which may be solid plastic glass or a film suitable for applying to a transparent glass or plastic structure).

Moreover, by selecting the composition of the QDs in a suitable way it is advantageously possible to avoid heavy metals (such as cadmium, lead or mercury) or other elements of known toxicity (for example tellurium or arsenic), thus providing a product which is compatible with environmental requirements and harmless to health.

Because of the invention, therefore, the functions of absorption and optical emission are decoupled, not by means of a particular nanostructuring of the material, but by using intrinsic defect states of the semiconductor nanocrystal which, as stated above, may be a ternary chalcogenide of metals such as copper and silver (for example, copper or silver indium sulphide or selenide) or alloys of these (CuInSe$_x$S$_{2-x}$, AgInSe$_x$S$_{2-x}$), or quaternary compounds comprising zinc for example, such as CuInZnS$_2$, CuInZnSe$_2$, AgInZnS$_2$, AgInZnSe$_2$ and alloys of these. This decoupling of the absorption and emission functions ensures that the QDs do not absorb their emission, whatever the chosen size may be, thus enabling large devices, or concentrators, to be produced.

Furthermore, in these devices the optical absorption and emission spectra can be selected by dimensional modulation of the nanocrystal, using the quantum confinement effect of the wave functions of the carriers in the quantized states of the semiconductor, and both may be extended to the near infrared. This makes it possible to produce materials which absorb the whole visible spectrum, thus causing the colouring of the final device to be neutral or in tones of grey or brown (technically colourless) and therefore suitable for use in urban settings.

An appropriate choice of the synthesis parameters also makes it possible to modulate the dimensions of the nanocrystals so that the optical absorption extends over the whole visible spectrum and over the near infrared up to about 1000 nm, and so that the emission falls within the limits of operation at high wavelengths (1100 nm) of silicon solar cells. This makes these nanocrystals simpler to use for the proposed purposes, and fully compatible with well-established technologies such as silicon photovoltaic cells. These dimensions can also be modulated further to make the optical absorption extend further into the near infrared so that the emission falls within the operating region of non-standard solar cells, for example those based on germanium (1800 nm), indium and gallium arsenide (up to 3200 nm), and others.

In a luminescent solar concentrator produced according to the invention, each QD acts as an optical antenna which absorbs the light incident on the body 1 by means of its band-to-band optical transitions that are controllable by means of the dimensions of the nanocrystal, so as to obtain continuous absorption spectra over the whole visible spectrum. As a result of this optical absorption, the photogenerated carriers are radiatively recombined on intra-gap defect states at wavelengths longer than the absorbed light. Since the concentration of these states is minimal relative to the amount of semiconductor material forming the QDs—in fact, they mainly arise as a result of substoichiometry of the elements forming the QDs, or as a result of structural defects (holes and/or interstitial defects) in the crystal matrix—the optical absorption of the impurities is negligible relative to the band-to-band absorption of the QDs. Because of this characteristic, it is possible to produce structures in which the functions of absorption and optical emission are decoupled, and which can therefore transmit the intrinsic luminescence with limited reabsorption.

Examples of embodiments are indicated below: a first embodiment of the invention provides for the production of solid concentrators by dispersing nanocrystals in a plastic matrix of polymethyl methacrylate/poly(lauryl methacrylate) and epoxy resins produced by an industrial process using the process known as "cell casting" and/or in situ polymerization, which keeps the optical properties and the emission efficiency of the nanoparticles intact. A second embodiment is based on the manufacture of active films enriched with nanocrystals to be used as a coating for glass and/or plastic windows.

Both of the aforementioned embodiments provide devices with greatly reduced self-absorption, capable of absorption over the whole visible solar spectrum and in the near infrared. The performance of the solar concentrator in terms of suppression of optical losses by reabsorption is considerably better than that of the prior art for devices operating in the near infra-red spectral region.

A particular embodiment of an LSC containing QDs of the aforementioned type will now be described. By way of example, let us consider nanocrystals with constituents based on ternary semiconductor chalcogenides of the I$^B$-III$^A$-VI$^A{}_2$ type, such as CuInS$_2$ (referred to as CIS for brevity), CuInSe$_2$ (referred to as CISe) and alloys of these (CuInSe$_x$S$_{2-x}$ or CISeS); these nanocrystals contain no heavy metals and can be manufactured in large quantities by methods with high chemical efficiency, which do not use reagent injection and use inexpensive precursors. Furthermore, their large impact cross section for optical absorption and their absorption which can be extended spectrally to the near infra-red region makes them highly suitable for the collection and conversion of solar radiation.

The aforesaid QDs are also highly efficient emitters with a luminescence spectrum that can be selected by dimensional control, and their photoluminescence quantum efficiency can be raised to more than 80% by means of suitable surface treatment or passivation. This may consist of either organic molecules or a thin outer layer of an inorganic material with a large energy gap, such as zinc sulphide or selenide, or a combination of both of these materials.

In the example, CISeS nanocrystals were used, these nanocrystals being passivated with a thin layer of ZnS further coated with oleic acid to form an LSC with a large surface area and reduced reabsorption losses, and extended coverage of the whole visible spectrum. This passivation of the CISeS QD made it possible to preserve the spectral emission properties as well as the emission efficiency of the QD after its exposure to the radical initiators required for the process of polymerization of the plastic matrix. The incorporation of the QDs into a cross-linked poly(lauryl methacrylate) matrix resulted in a polymer sheet which was colourless and autonomous or self-supporting, and had an excellent optical quality. This incorporation does not give rise to any detectable chromatic distortion of the light transmitted, reflected and diffused by the LSC. This sheet is therefore suitable for incorporation into existing structures or new structures, for example for forming or producing photovoltaic windows.

By using the LSC made in this way, an optical power conversion efficiency of up to 3.2% of the incident solar radiation was obtained, a high value by comparison with that currently obtained with large devices. The maximum value reported at present for LSCs with dimensions comparable to the invention (equal to 10 cm×10 cm) is 1.8%, although this is obtained by coating the reverse of the sheet with a reflective layer which greatly increases the efficiency, but makes the device totally opaque and therefore unsuitable for architectural incorporation.

Figure 2:
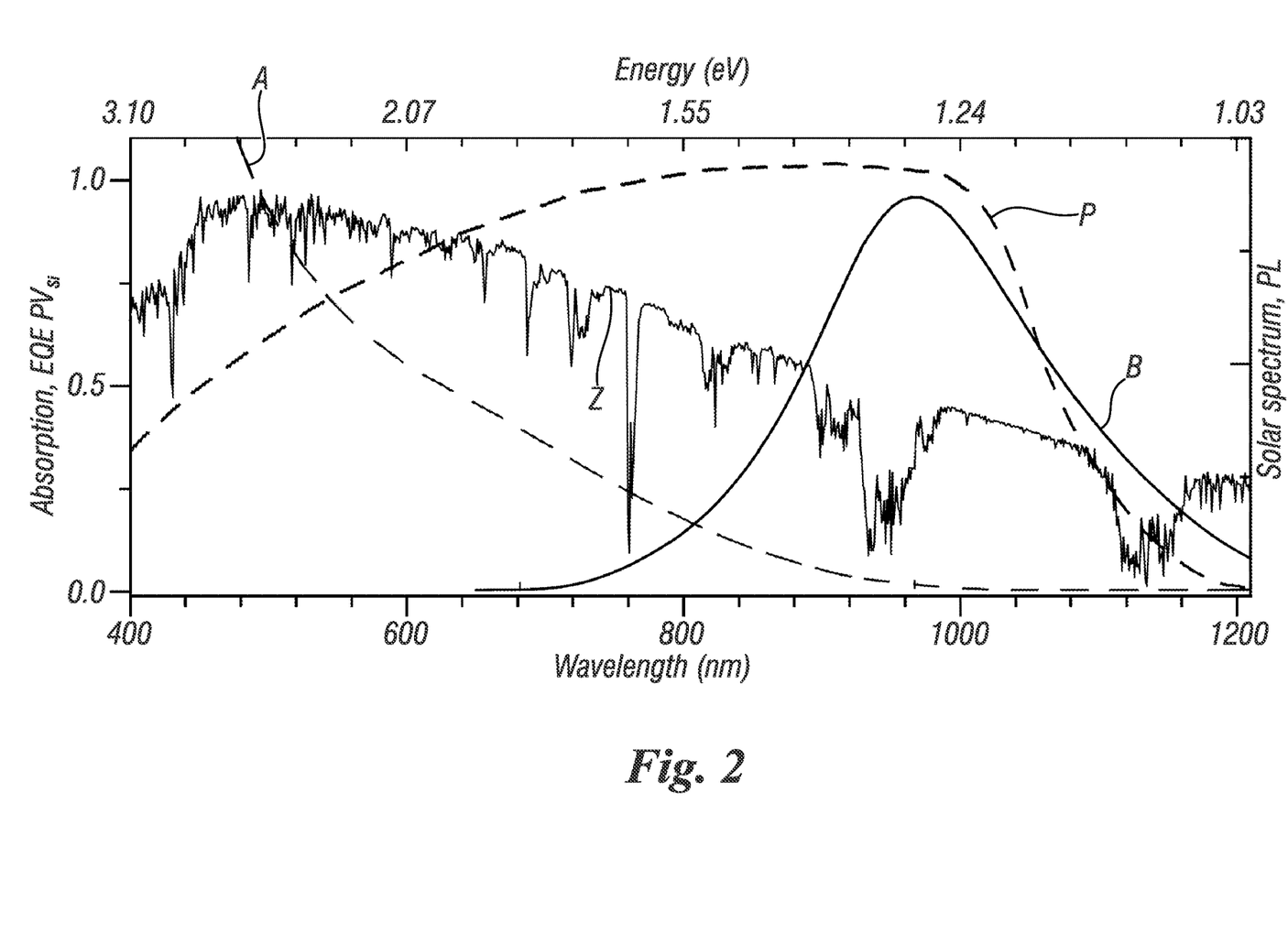
FIG. 2 shows an absorption spectrum (line A) and a photoluminescence spectrum (line B) of CISeS QDs passivated with a layer of ZnS, used to produce the device or concentrator of FIG. 1 under optical excitation at 405 nm.

The optical absorption and photoluminescence spectra of the QDs dispersed in a common solvent such as toluene are shown in FIG. 2, which demonstrates the suitability of these QDs for high-efficiency colourless LSCs. The absorption spectrum (line A) extends over the whole visible region and reaches the near infrared, thus ensuring optimal utilization of the solar radiation, the shape of which at sea level is represented by the line Z (spectrum A.M. 1.5 G). The photoluminescence spectrum (line B) is centred at 960 nm, where its absorption is practically negligible and the efficiency of the monocrystalline silicon solar cells is at a maximum. In fact, an excellent overlap can be seen between the luminescence spectrum and the external quantum efficiency curve typical of a monocrystalline silicon photovoltaic cell (line P) which reaches a maximum value at the emission peak.

The poly(lauryl methacrylate) (PLMA) matrix was chosen for use because this polymer has long side chains which prevent the agglomeration of the nanocrystals, and has been used successfully for the manufacture of polymer-QD nanocomposites of high optical quality. The production process consists in initially dispersing the nanoparticles in a small volume of lauryl methacrylate (LMA) for about 3 hours, to ensure a fine dispersion of the individual QDs. The resulting mixture is then added to a volume of monomer together with a cross-linking agent, for example ethylene glycol dimethacrylate (EGDM). In particular, the ratio between the QD-LMA and EGDM mixture used here is 20%:80% by weight (w/w). A radical photo-initiator, for example that known by the trade name Irgacure 651, was also added, in an amount equal to 1% by weight (w/w).

Figure 3:
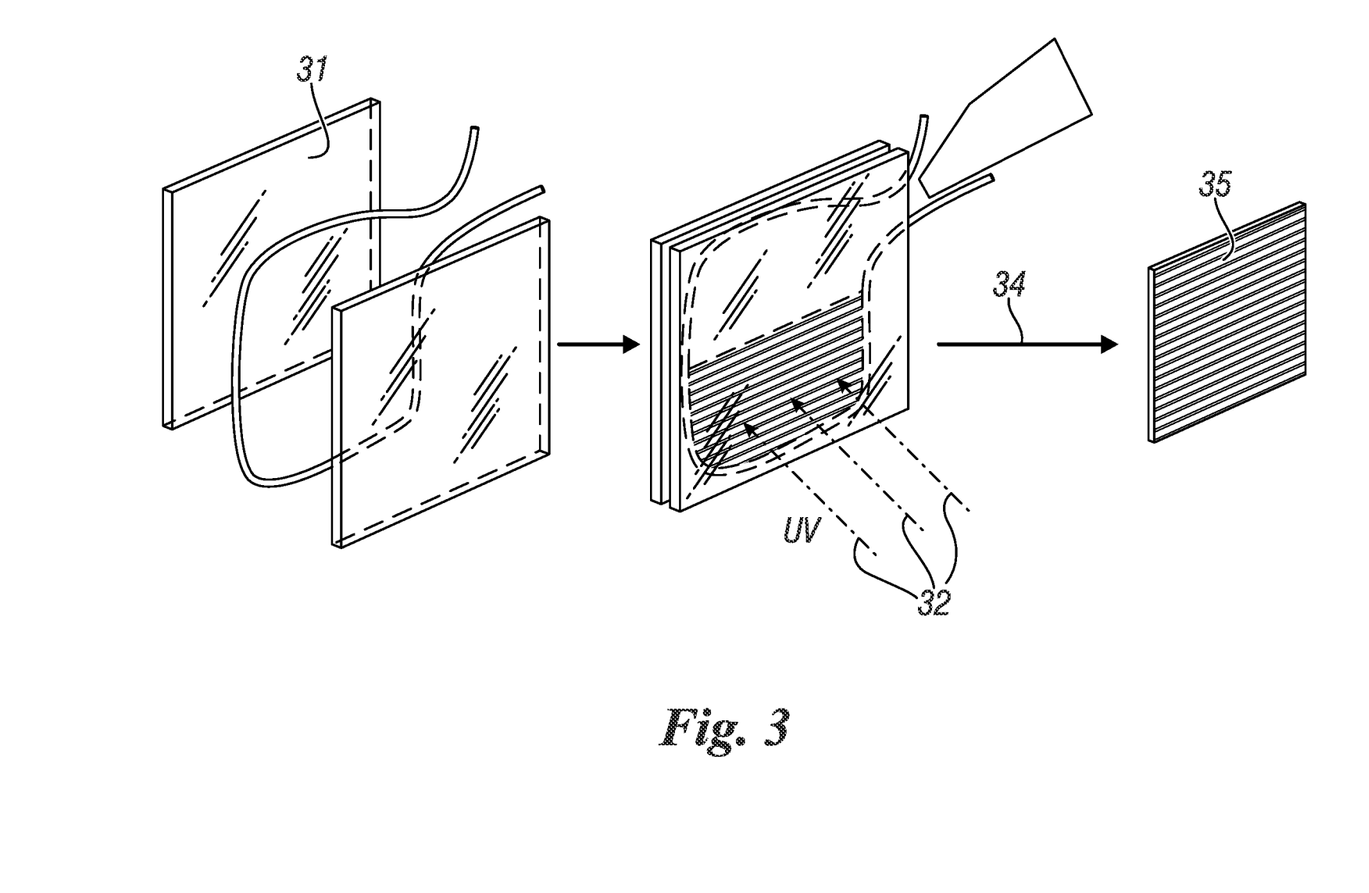
FIG. 3 shows a schematic representation of the procedure for producing a cell for the construction of the LSC according to the invention.

After mixing for about 20 minutes and after treating the whole mixture in an ultrasonic bath for about 10 minutes, the solar concentrator was produced by the cell casting procedure typical of the preparation of optical polymer sheets. This is shown in FIG. 3. In particular, the homogeneous mixture produced as described above was poured into a mould 31 made of low-roughness tempered glass, and irradiated (this procedure being indicated by the arrows 32 in this figure) with light at 365 nm for 5 minutes to activate the radical polymerization. The polymerization was then completed in the dark for 30 minutes, after which the waveguide was removed from the mould, cut and polished along the peripheral edges (this procedure being indicated by the arrow 34).

Because of the particularly large area of the final device, the specimen was kept in the mould throughout the polymerization process (5 minutes of irradiation and 30 minutes of rest) to prevent the development of cracks. After this procedure, a final sheet-like material 35 of high optical quality was obtained.

Figure 4:
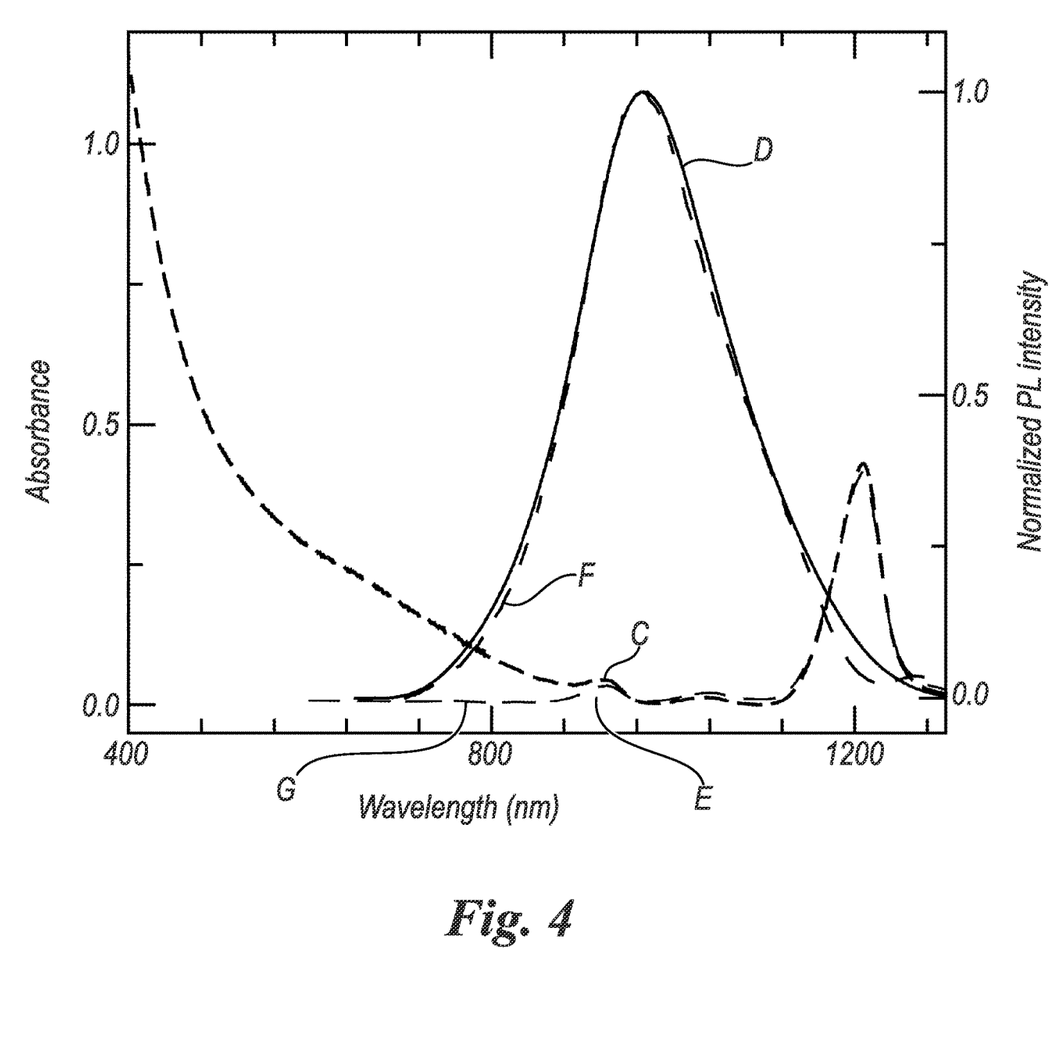
FIG. 4 shows the absorption spectrum (line E) and photoluminescence spectrum (line F) under excitation at 405 nm of CISeS QDs (which are defined below) passivated with a layer of ZnS and used for the exemplary device, compared with the corresponding absorption spectrum (line C) and emission spectrum (line D) of the same QDs dispersed in toluene, one of the typical solvents in which QDs are dispersed in the design phase.

Spectroscopic measurements on the resulting material show that the optical properties of the QDs are entirely resistant to exposure to the radical polymerization procedure. FIG. 4 shows the absorption spectrum (line C) and photoluminescence spectrum (line D) of the nanoparticles in a solution of toluene and incorporated into the photopolymerized matrix of cross-linked poly(lauryl methacrylate) as described previously (lines E and F respectively) under excitation at 405 nm. The absorption spectrum of the matrix is shown as the line G.

Figure 5:
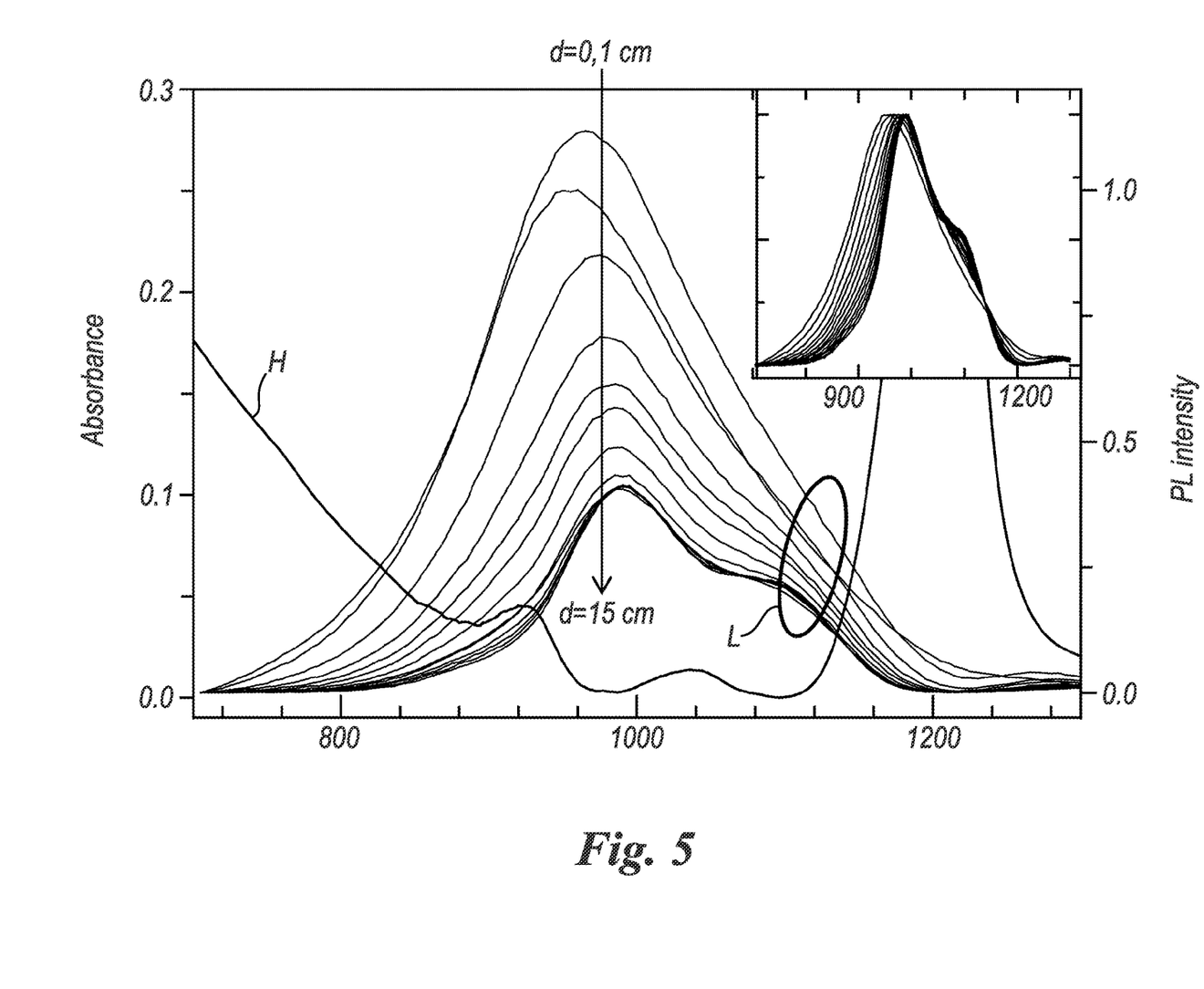
FIG. 5 shows a luminescence spectrum of CISeS QDs passivated with a layer of ZnS collected at the edges of the LSC when the excitation point was located at an increasing distance "d" from the edge.

FIG. 5 shows the absorption spectrum measured across the thickness of the resulting sheet (line H) and the photoluminescence and luminescence spectra (lines L) measured when the concentrator was excited at an increasing distance "d" from one of the peripheral edges of the sheet where the detector was located. The photoluminescence spectra collected in this way show a progressive fall in intensity with the increase of "d", caused only partially by the reabsorption of the luminescence, and mainly due to the loss of photons from the upper and lower faces of the waveguide. The latter effect is caused by the optical diffusion from superficial and deep imperfections of the polymer compound, which can easily be eliminated by improving the cell casting process. To clarify how much of the measured loss is actually due to self-absorption, the graph inserted in FIG. 5 shows, for the purpose of comparison, the normalized photoluminescence spectra whose shape variation depends exclusively on the absorption by the QDs and by the polymer matrix itself (it should be noted that the matrix only exhibits weak optical absorption in the optical window concerned: see line H in FIG. 5). It will be noted that the distortion of the spectral profile is minimal for long optical distances "d" (12 cm). This additional analysis of the results demonstrates that the suppression of reabsorption achieved with the CISeS nanoparticles passivated with ZnS used in the exemplary embodiment examined here is particularly evident if it is borne in mind that previously known luminescent solar concentrators operating in a near infra-red region (using nanoparticles based on heavy metals such as PbS) showed about 70% of the optical loss due to reabsorption for optical paths ("d") of less than 8 cm.

An important aspect of the development of luminescent solar concentrators is that they can be used to obtain LSC-based photovoltaic windows which are not coloured; that is to say, they have no selective absorption of particular wavelengths of light, thus preventing the distortion of colour perception and the chromatic filtering of the transmitted sunlight.

All these results are achieved by using ternary semiconductor QDs of the $I^B$-$III^A$-$VI^A_2$ type, comprising transition metals of group $I_B$ (or group 11 in the IUPAC nomenclature), metals of group $III_A$ (or group 13 in the IUPAC nomenclature) and chalcogens of group VIA (or group 16 in the IUPAC nomenclature), or alloys of these, or by using quaternary semiconductors of the aforesaid type comprising, for example, zinc as $CuInZnS_2$, $CuInZnSe_2$ or $AgInZnS_2$, $AgInZnSe_2$.

Because of the invention, it is therefore possible to produce luminescent solar concentrators with reduced reabsorption losses based on colloidal nanocrystals with a large Stokes shift (>0.2 eV) included in a plastic or silica-based glass matrix. By using these nanocrystals, it is possible to overcome all the limitations encountered previously with the use of either organic or QD-based chromophores, these limitations being typically associated with a partial coverage of the spectrum of sunlight and the consequent intrinsically limited optical power conversion efficiency, and the strong colouring of the resulting solar concentrators, as well as the toxicity of the constituent elements of QDs with large Stokes shifts.

In particular, with the embodiment described above, a power conversion efficiency of up to 3.2% was obtained, this being a high value for an LSC with a large surface area (12 cm by 12 cm).

Moreover, a concentrator produced according to the invention is essentially free of colour, and therefore does not introduce distortion into colour perception, or cause any chromatic filtering of the transmitted sunlight.

A particular embodiment of the invention has been described; however, other embodiments may be created in the light of the content of the preceding description, and are such that they are considered to fall within the scope of the following claims.

The invention claimed is:

1. A solar concentrator comprising a body made of polymer material or silica-based glass containing colloidal nanocrystals, wherein the nanocrystals are nanocrystals of at least ternary semiconductor chalcogenides, quaternary semiconductor chalcogenides, or alloys thereof, the nanocrystal size being smaller than the exciton Bohr radius,
wherein the ternary semiconductor chalcogenides comprises transition metals of group 11, in the IUPAC nomenclature, metals of group 13 in the IUPAC nomenclature and chalcogens of group 16 in the IUPAC nomenclature,
wherein the quaternary semiconductor chalcogenides comprises transition metals of group 11 in the IUPAC nomenclature, zinc, metals of group 13 in the IUPAC nomenclature, and at least one chalcogen of group 16 in the IUPAC nomenclature,
wherein the nanocrystals are free of cadmium, lead and mercury such that the solar concentrator is compatible with environmental requirements, and the nanocrystals are re-absorption free,
wherein the body comprises four edges,
wherein the nanocrystals form a homogenous structure in which optical absorption is due to band-to-band transitions of the semiconductor chalcogenides, such that emitted light is not reabsorbed by the nanocrystals and instead propagated to the four edges of the body,
wherein the nanocrystals comprise quaternary semiconductor chalcogenides, and wherein the nanocrystals have a composition according to the following formulation:
$M^I M^{III} M^{VI}_2$, wherein
$M^I$ is a transition metal of group 11 in the IUPAC nomenclature,
$M^{III}$ is a transition metal of group 13 in the IUPAC nomenclature,
$M^{II}$ is zinc, and
$A^{VI}_2$ is a chalcogen of group 16 in the IUPAC nomenclature.

2. The solar concentrator according to claim 1, wherein the nanocrystals comprises metals selected from the group consisting of copper, silver, zinc, aluminium, indium and gallium.

3. The solar concentrator according to claim 1, wherein the nanocrystals have a large Stokes shift of more than 0.2 eV.

4. The solar concentrator according to claim 1, wherein the body comprises at least one of the following polymers: polyacrylates, polymethyl methacrylates, polyolefins, polyvinyls, epoxy resins, polycarbonates, polyacetates, polyamides, polyurethanes, polyketones, polyesters, polycyanoacrylates, silicones, polyglycols, polyimides, fluorinated polymers, polycellulose, cellulose derivatives polyoxazines, and silica-based glasses.

5. The solar collector according to claim 4, wherein the cellulose derivatives are selected from the group consisting of methyl cellulose and hydroxymethyl cellulose.

6. The solar concentrator according to claim 1, wherein the solar concentrator has a sheet-like configuration in which the nanocrystals are dispersed in the body.

7. The solar concentrator according to claim 1, wherein the solar concentrator has a film-like configuration.

8. A solar concentrator comprising a body made of polymer material or silica-based glass containing colloidal nanocrystals, wherein the nanocrystals are nanocrystals of at least ternary semiconductor chalcogenides, quaternary semiconductor chalcogenides, or alloys thereof, the nanocrystal size being smaller than the exciton Bohr radius,
wherein the ternary semiconductor chalcogenides comprises transition metals of group 11, in the IUPAC nomenclature, metals of group 13 in the IUPAC nomenclature and chalcogens of group 16 in the IUPAC nomenclature,
wherein the quaternary semiconductor chalcogenides comprises transition metals of group 11 in the IUPAC nomenclature, zinc, metals of group 13 in the IUPAC nomenclature, and at least one chalcogen of group 16 in the IUPAC nomenclature,
wherein the nanocrystals are free of cadmium, lead and mercury such that the solar concentrator is compatible with environmental requirements, and the nanocrystals are re-absorption free,
wherein the body comprises four edges,
wherein the nanocrystals form a homogenous structure in which optical absorption is due to band-to-band transitions of the semiconductor chalcogenides, such that emitted light is not reabsorbed by the nanocrystals and instead propagated to the four edges of the body,
wherein the nanocrystals comprise quaternary semiconductor chalcogenides, and wherein the nanocrystals have a composition according to the following formulation:
$M^I M^{III} M^{II}_{2-x} B^{VI}_x$, wherein
$M^I$ is a transition metal of group 11 in the IUPAC nomenclature,
$M^{III}$ is a transition metal of group 13 in the IUPAC nomenclature,
$M^{II}$ is zinc, $A^{VI}$ is a chalcogen of group 16 in the IUPAC nomenclature, $B^{VI}$ is a chalcogen of group 16 in the IUPAC nomenclature, x is a number of atom of the element $B^{VI}$, and 2-x is a number of atom of the element $A^{VI}$, wherein x is 0<X<2.

9. The solar concentrator according to claim 8, wherein the nanocrystals have a large Stokes shift of more than 0.2 eV.

10. The solar concentrator according to claim 8, wherein the body comprises at least one of the following polymers: polyacrylates, polymethyl methacrylates, polyolefins, polyvinyls, epoxy resins, polycarbonates, polyacetates, polyamides, polyurethanes, polyketones, polyesters, polycyanoacrylates, silicones, polyglycols, polyimides, fluorinated polymers, polycellulose, cellulose derivatives polyoxazines, and silica-based glasses.

11. The solar collector according to claim 10, wherein the cellulose derivatives are selected from the group consisting of methyl cellulose and hydroxymethyl cellulose.

12. The solar concentrator according to claim 8, wherein the solar concentrator has a sheet-like configuration in which the nanocrystals are dispersed in the body.

13. The solar concentrator according to claim 8, wherein the solar concentrator has a film-like configuration.

14. A window for a building or for a moving structure, comprising at least one luminescent solar concentrator according to claim 1.

15. A window for a building or for a moving structure, comprising at least one luminescent solar concentrator according to claim 8.

* * * * *